(12) United States Patent
Long

(10) Patent No.: US 6,247,108 B1
(45) Date of Patent: *Jun. 12, 2001

(54) MEMORY MANAGEMENT DURING PROCESSING OF BINARY DECISION DIAGRAMS IN A COMPUTER SYSTEM

(75) Inventor: David E. Long, New Providence, NJ (US)

(73) Assignee: Lucent Technologies Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,835

(22) Filed: Jun. 3, 1998

(51) Int. Cl.[7] .................................................. G06F 12/00
(52) U.S. Cl. .......................... 711/216; 707/1; 707/3; 707/100
(58) Field of Search ............................. 711/216; 707/1, 707/3, 100

(56) References Cited

U.S. PATENT DOCUMENTS

| | | | |
|---|---|---|---|
| 3,602,895 | * 8/1971 | Loizides | 707/1 |
| 5,551,027 | * 8/1996 | Choy et al. | 707/201 |
| 5,682,320 | 10/1997 | Khouja et al. | |
| 5,737,242 | 4/1998 | Madre et al. | |
| 5,813,000 | * 9/1998 | Furlani | 707/3 |
| 5,978,795 | * 11/1999 | Poutanen et al. | 707/3 |

OTHER PUBLICATIONS

Rudell, Richard, Dynamic Variable Ordering for Ordered Binary Decision Diagrams, IEEE 1063–6757, 1993.*

Randal E. Bryant, Graph–Based Algorithms for Boolean Function Manipulation, IEEE Transactions on Computers, vol. C–35, No. 8, Aug. 1, 1986.

Karl S. Brace, Richard L. Rudell, Randal E. Bryant, Efficient Implementations of a BDD Package, 27th ACM/IEEE Design Automation Conference, Paper 3.1, 1990.

Nils Klarlund, Theis Rauhe, BDD Algorithms and Cache Misses, Technical Report, Dept. of Computer Science, University of Aarhus, BRICS Report Series RS–96–5, 1996.

* cited by examiner

*Primary Examiner*—Matthew Kim
*Assistant Examiner*—Matt Anderson

(57) ABSTRACT

A method for improved memory management during the processing of binary decision diagrams in a computer system. Prior to creating a new node in memory, a find operation is performed to determine if that node already exists in memory. A hash key is computed for the new node and a hash table is accessed to retrieve a pointer to a linked list of nodes which are potential matches for the new node. The linked list is in increasing order of the chronological age of the nodes. The nodes are sequentially retrieved from main memory in the order of the linked list. The retrieval is terminated at the last linked node which was created subsequent to the child nodes of the new node.

6 Claims, 5 Drawing Sheets

MEMORY MANAGEMENT DURING PROCESSING OF BINARY DECISION DIAGRAMS IN A COMPUTER SYSTEM

FIELD OF THE INVENTION

The present invention relates generally to the representation and manipulation of binary decision diagrams in a computer system. More particularly, the present invention relates to improved memory management during the processing of binary decision diagrams in a computer system.

BACKGROUND OF THE INVENTION

Boolean algebra is an important aspect of computer science and digital system design. For example, many problems in computer-aided design for digital circuits can be solved through the use of Boolean functions. Thus, the efficient symbolic representation and manipulation of Boolean functions in the memory of a computer system is important.

One technique for representing a Boolean function is the use of a binary decision diagram (BDD). A BDD is a directed acyclic graph with each non-terminal node labeled with a Boolean variable and having a 0-branch and a 1-branch, corresponding to the value of the Boolean variable. Nodes which are directly connected to the 0-branch and 1-branch of a higher level node are called the child nodes of the higher level node. The higher level node is called the parent node of the child nodes. The BDD also has terminal nodes, which are labeled 0 or 1, representing the constant Boolean functions 0 and 1. An example of a BDD 100 representing the Boolean function X*Y+Z (* represents the Boolean operator AND; + represents the Boolean operator OR) is shown in FIG. 1. The BDD 100 has three non-terminal nodes, X, Y and Z, and terminal nodes 0 and 1. Nodes are represented herein as follows: a node with label x having a 0-branch child y and 1-branch child z, is represented by the notation node (x,y,z).

An ordered binary decision diagram (OBDD) is a BDD with the constraint that the input variables are ordered such that the traversal of any branch of the BDD will result in visiting the variables in the given order. Thus, given a variable ordering of X,Y,Z, the BDD 100 in FIG. 1 is ordered because the traversal of any of the branches of the BDD will result in visiting the variables in the given order. Finally, a reduced ordered binary decision diagram (ROBDD) is an OBDD where each node represents a distinct logic function. As used hereinafter, the term BDD refers to a ROBDD.

The use of BDD's for the efficient processing of Boolean functions is described in detail in R. Bryant, Graph-Based Algorithms for Boolean Function Manipulation, IEEE Transactions On Computers, Vol. C-35, No. 8, August 1986; and K. Brace, R. Rudell, and R. Bryant, Efficient Implementation of a BDD Package, paper 3.1, 27$^{th}$ ACM/IEEE Design Automation Conference, 1990; both of which are incorporated herein by reference. Thus, the details of the use of BDD's for processing Boolean functions is well known to those skilled in the art and will not be described in detail herein.

One problem with the use of the known techniques for representing and manipulating BDD's during the processing of Boolean functions in a computer system is that performance of the computer system may become slow because of the large number of main memory accesses required. Main memory has slow access time relative to the speed of the central processing unit. The use of cache memory can sometimes improve processing speeds when sequential main memory accesses are made to memory locations which are near to each other. However, one of the problems with the known BDD representation and manipulation techniques is that there may be many sequential main memory accesses to locations which are in widely disparate memory locations. This results in many cache misses, further slowing the overall processing speed.

Additionally, during the processing of BDD's which are stored in the memory of the computer system, it is often required to create a new BDD in memory. During the creation of the new BDD, various nodes will be created. If the same node is to be created more than once, it is desirable to refer to the already created node rather than to create a duplicate of an existing node, thereby saving memory space. In accordance with known techniques, each time a new node is created in memory, an entry is made in a hash table. The hash table entry contains a pointer to the memory location in which the newly created node is located. Thus, when a new node is about to be created, the hash key of the new node is computed and the hash table entry corresponding to the computed hash key is interrogated. The node in the memory location contained in the hash table entry is retrieved from main memory to determine whether the stored node is the same as the node that is about to be created.

However, as a result of the general properties of hash tables, various unrelated nodes may have the same hash key and will therefore be assigned the same entry in the hash table. Thus, a single hash table entry may be linked to various memory locations. As a result, when a particular node is being searched for, each of the nodes with the same hash key must be retrieved from memory in order to determine whether they match the desired node. Each of these memory accesses slows the performance of the system.

In view of the current state of the art in high speed central processing units, the biggest performance bottleneck in the known BDD computer packages is the relatively long latency of main memory. Thus, each access to main memory severely impairs the processing speed of the computer while performing BDD manipulation.

SUMMARY OF THE INVENTION

The present invention solves the problem of slow BDD processing because of a large number of main memory accesses by exploiting several characteristics of BDD processing in a computer system. More specifically we have recognized that new BDD's are created from the bottom, i.e., leaves, up, and as a result the children of a node must be chronologically older than the node itself. Thus, in accordance with the invention, when trying to find a particular node in memory, only nodes which were created subsequent to the child nodes of the particular node are retrieved from memory. Nodes which were created prior to the child nodes of the particular node are not retrieved from memory, as was the practice in the prior art techniques. Thus, the invention provides a technique which advantageously reduces the number of main memory accesses when trying to find a particular node in memory.

In accordance with one aspect of the invention, the chronological age of a node is determined by reference to the address at which the node is stored in memory. In accordance with this aspect of the invention, newly created nodes are stored in memory locations which are higher than any of the previously created nodes. Thus, when searching for a particular node in memory, only nodes which are stored in memory locations which are higher than the memory locations in which the children of the particular node are stored are retrieved from memory. Of course, alternatively, the chronological ordering of nodes could be reversed such that newly created nodes are stored in memory locations which are lower than any of the previously created nodes. In which case, when searching for a particular node in memory, only nodes which are stored in memory locations which are lower than the memory locations in which the children of the particular node are stored are retrieved from memory In accordance with another aspect of the invention, a hash table is used to identify a linked list of nodes stored in memory. The linked list identifies nodes which may match the particular node being searched for, and is linked in increasing chronological order. The list is searched sequentially for the particular node being searched for, but the search is terminated at the last linked node which was created subsequent to both of the child nodes of the particular node being searched for.

DETAILED DESCRIPTION

Figure 1:
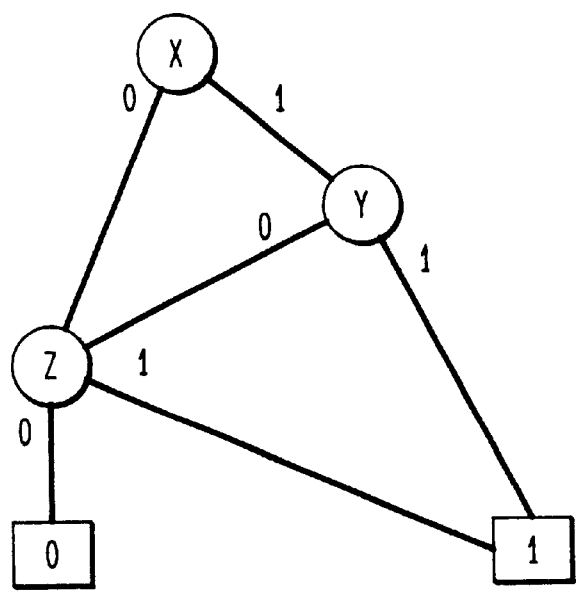
FIG. 1 shows a BDD representing the Boolean function X*Y+Z.
Figure 2:
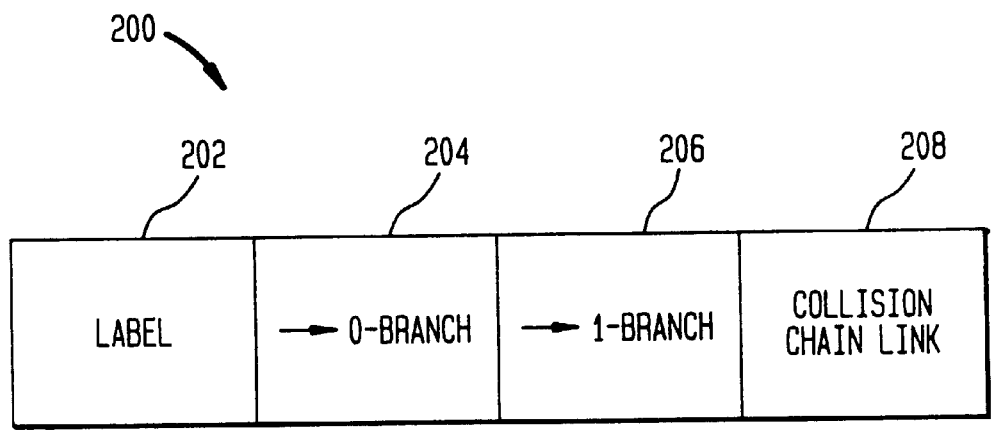
FIG. 2 shows a node record which is used to represent a node in the memory of a computer.

FIG. 2 shows a node record 200 which is used to represent a node of a BDD in the memory of a computer. Node record 200 includes a label field 202 which contains the node's label, a field 204 which contains a pointer to the memory location in which the node's 0-branch child node is stored, a field 206 which contains a pointer to the memory location in which the node's 1-branch child node is stored, and a field 208 which contains a collision chain link. Field 208 will be described in further detail below.

Figure 3:
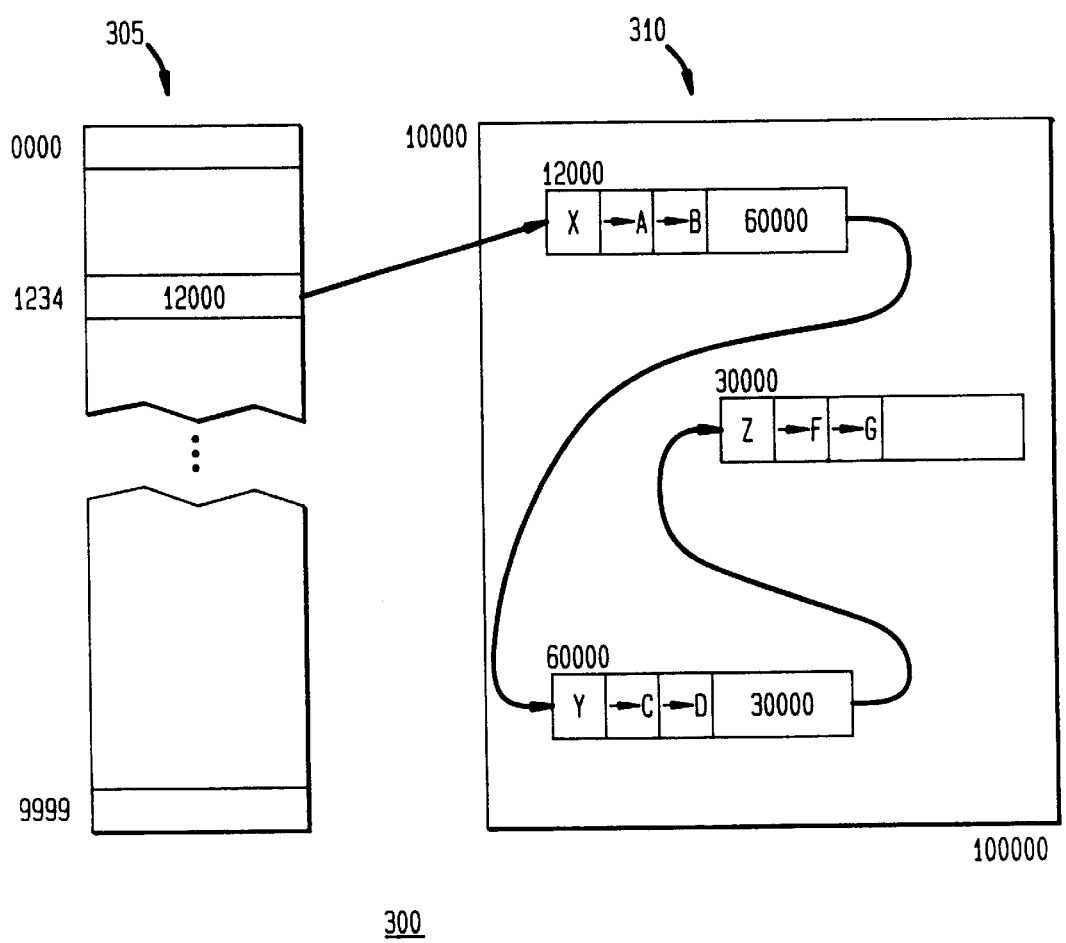
FIG. 3 is a schematic representation of the memory of a computer system.

FIG. 3 is a schematic representation of the memory 300 of a computer system and is used to illustrate the problem of slow BDD processing because of a large number of main memory accesses of the prior art. In accordance with prior techniques, a hash table 305 is maintained in memory to assist in finding nodes which have already been created and stored in memory. In the example shown, the hash table 305 begins at memory location 0000 and ends at location 9999 and the general main memory 310 starts at location 10000 and ends at location 100000. Although it is sometimes conventional to use binary or hexadecimal representation when referring to memory locations, all memory location references herein are made in decimal representation for ease of reference.

When a new node is created, its hash key is computed and the node's location in memory 310 is stored at the appropriate entry in the hash table 305. For example, consider a node having label X, and child nodes A and B, which is stored at memory location 12000. When this node was created, it was stored in memory location 12000 and its hash key was determined to be 1234 using well known hashing techniques. Therefore, the value 12000 was stored at location 1234 of the hash table 305.

Next, assume that the node having label Y with children C and D was about to be created. In order to determine if the node already exists, the hash key of node Y is computed. Assume for purposes of this example that the hash key of node Y is computed to be 1234, which is the same as the hash key of node X. Thus, the hash table 305 entry at location 1234 is accessed and the location 12000 is retrieved. Therefore, a main memory 310 access is made to retrieve the node stored at location 12000.

Upon retrieving node X from location 12000, it is determined that the newly created node Y is not already stored at location 12000, and thus the newly created node Y must be stored in memory with an appropriate entry in the hash table 305. To this end, node Y is stored in main memory 310 at location 60000. However, with respect to the hash table 305 entry for node Y, there is already an entry at Y's computed hash key of 1234, namely the entry for node X. Thus, there is a hash table collision.

A hash table collision is resolved by using the collision chain link field 208 (FIG. 2) of the node representation, which is a pointer to the next node with the same hash key. Such a linking of elements having the same hash key is called a collision chain. In the example, the memory location of 60000 is stored in the collision chain link field of node X to resolve the collision.

Next, assume that the node having label Z with children F and G is about to be created. In order to determine if the node was already created, the hash key of node Z is computed. Assume for purposes of this example that the hash key of node Z is computed to be 1234, which is the same as the hash key of nodes X and Y. Again, the hash table 305 entry at location 1234 is accessed to retrieve location 12000, and a main memory 310 access is made to retrieve the node stored at location 12000. Upon retrieving node X from location 12000 it is determined that the newly created node Z is not already stored at location 12000. It is also determined that the collision chain link of node X contains the location 60000. This necessitates another main memory 310 access to retrieve the node stored at location 60000. Note that there is a high likelihood that this main memory access will result in a data cache miss because nodes X and Y are likely to be stored in widely disparate memory locations, thus further slowing down the processing of the computer.

Upon retrieving node Y from location 60000, it is determined that the newly created node Z is not already stored at location 60000. Since at this point node Y would have nothing stored in its collision chain link, the newly created node Z must be stored in memory with an appropriate entry in the hash table 305. Node Z is stored in main memory location 30000 and the memory location 30000 is stored in Y's collision chain link.

One skilled in the art will appreciate that, as the collision chain grows, an increasing number of accesses to main memory will be made during a find operation, thus substantially slowing down the processing speed of the computer. Of course, as part of the processing, if the size of the collision chains grow too long, an increasing of the size of the hash table may be undertaken. However, such re-hashing and reconfiguring of the collision chains takes time, which also slows down the processing speed of the computer. Thus, there is a tradeoff between the length of the collision chains and how often re-hashing must be done. Generally, collision chain links are kept at a maximum average length of approximately 4 links.

The present invention solves the main memory access problem by exploiting, several characteristics of BDD processing in a computer system. Initially, it is important to note that during the creation of a new BDD, the new BDD is created from the bottom up. That is, a child node is always created prior to the parent node of that child. In other words, child nodes must be chronologically older than their parent node. Thus, in accordance with the present invention, during a find operation for a desired node, i.e., determining if the desired node exists in memory, it is only necessary to look at nodes which have the same hash key as the desired node and which are younger than, i.e., were created after, both of the child nodes of the desired node. Advantageously, doing so, along with the resulting method of performing a find operation, result in a significant reduction in the number of main memory accesses during BDD processing.

Thus, when searching for a particular node in memory in accordance with the inventive method, it is necessary to determine the age of other nodes stored in memory. In accordance with an advantageous embodiment, the age of a node is determined by its memory address. As new nodes are created, they are stored in increasing memory locations. In this way, older nodes occupy lower memory locations. Of course, there are other ways to store age information for nodes. For example, another field can be added to the node representation shown in FIG. 2 to store the age of the node. However, this results in a non-trivial memory cost.

Figure 4:
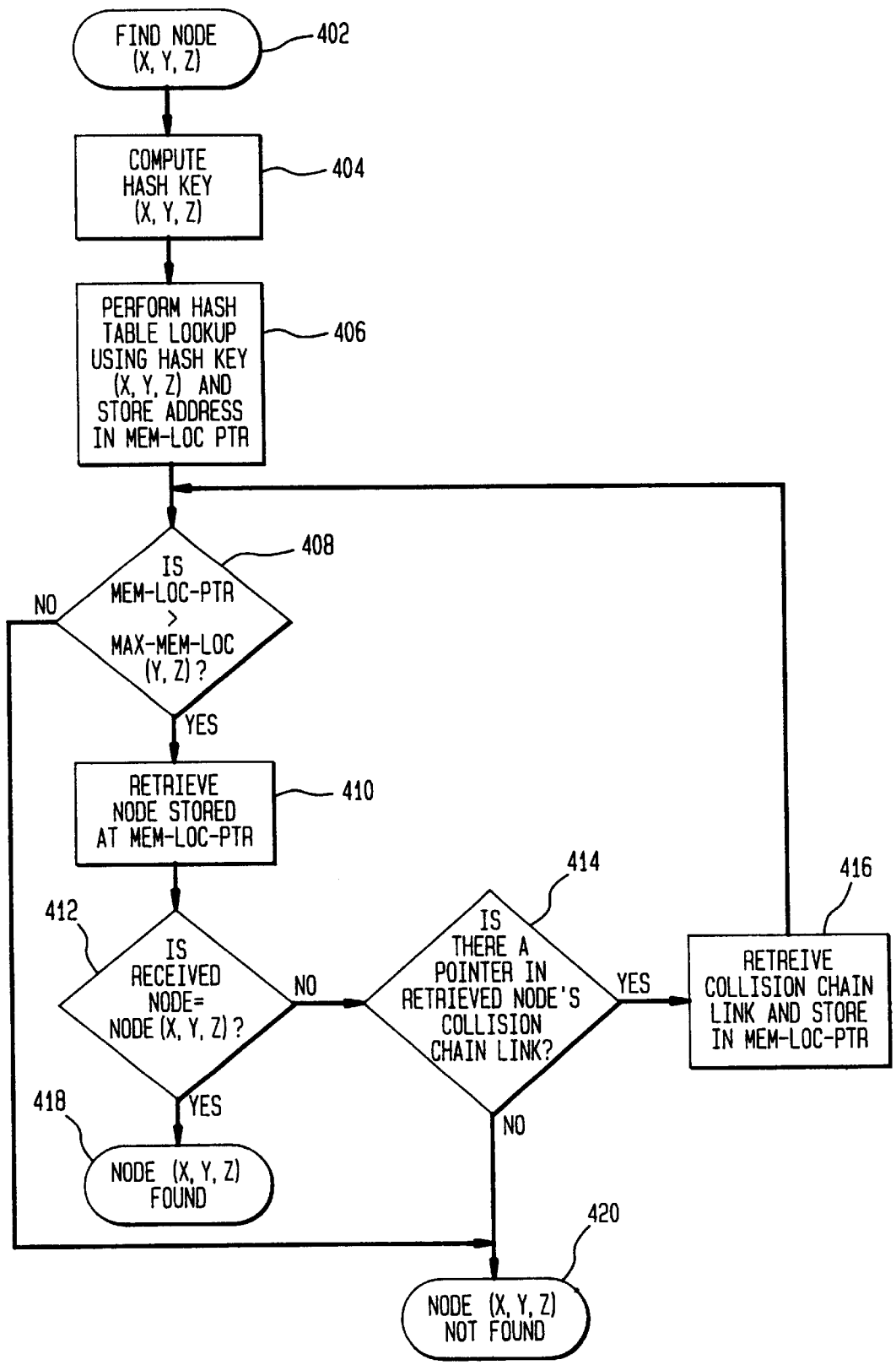
FIG. 4 is a flowchart showing the steps performed in the computer system during the processing of a BDD in accordance with the present invention.

The steps performed in the computer system during the processing of a BDD in accordance with the present invention are shown in the flowchart of FIG. 4. In step 402, the find node (x,y,z) function is initiated to find the node having label x and children y and z. In step 404 the hash key (x,y,z) for the node is computed. In step 406 a hash table lookup is performed using the hash key computed in step 404 and the address stored at the hash key entry in the hash table is retrieved and stored in mem-loc-ptr. In step 408 it is determined whether mem-loc-ptr is greater than max-mem-loc (y,z), where max-mem-loc(y,z) represents the higher memory location of nodes y and z. Thus, step 408 determines whether the address mem-loc-ptr retrieved from the hash table is greater than both the memory locations of the child nodes y and z. Since newly created nodes are stored in memory in increasing memory locations, the test in step 408 determines whether the node identified in the hash table is younger than both child nodes of x. If the test returns no, then the node pointed to by mem-loc-ptr cannot be the same as node x, and control passes to step 420 and the method ends with the node (x,y,z) not being found in memory.

If the test in step 408 is yes, then the node pointed to by mem-loc-ptr may be the same as node x because it is younger than both child nodes of node x. Control passes to step 410 where the node located at mem-loc-ptr is retrieved from memory. In step 412 the node retrieved from location mem-loc-ptr is compared with the desired node (x,y,z). If they are the same, then the node has been found and control passes to step 418 and the method ends. If the test of step 412 is no, then in step 414 it is determined whether there is a pointer in the retrieved node's collision chain link. If there is not, then the retrieved node is the last node in the collision chain, and control is passed to step 420 because the desired node has not been found. If the test in step 414 is yes, then there is another node in the collision chain and in step 416 the address in the retrieved nodes collision pointer link is retrieved and stored in mem-loc-ptr. Control now passes back to step 408 to determine whether the new address stored in mem-loc-ptr is greater than max-memloc(y,z). Thus, as described above, step 408 determines whether the new address stored in mem-loc-ptr retrieved from collision chain link of the prior tested node is greater than both the memory locations of the child nodes y and z. This determines whether the node stored at mem-loc-ptr is younger than both the child nodes of node x. Processing continues as described above.

Figure 5:
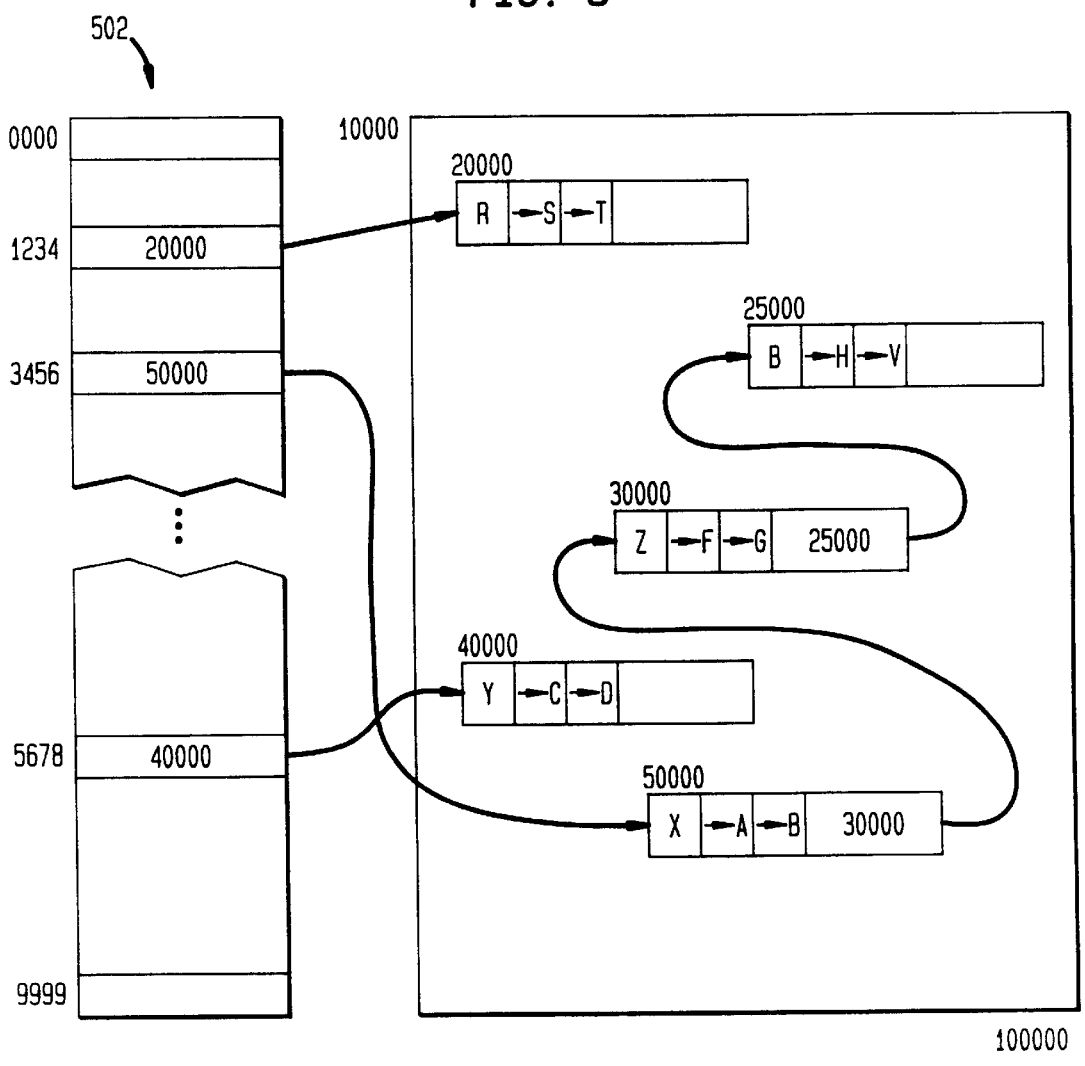
FIG. 5 is a schematic representation of the memory of a computer system.

The method shown in FIG. 4 will now be described further in conjunction with an example. FIG. 5 represents the memory 500 of a computer system. The memory 500 contains a hash table 502 at memory location 0000 through 9999 and main memory 504 at locations 10000 through 100000. Main memory stores the following nodes:

node (r,s,t) at memory location 20000 and having a hash key of 1234, node (b,h,v) at memory location 25000 and having a hash key of 3456;

node (z,f,g) at memory location 30000 and having a hash key of 3456;

node (y,c,d) at memory location 40000 and having a hash key of 5678; and node (x,a,b) at memory location 50000 and having a hash key of 3456.

It is noted that the nodes have been stored in memory in increasing memory locations based on chronological age, so that older nodes are stored at lower memory locations. In accordance with another aspect of the invention, the collision chain for any given hash key is linked in decreasing order of memory location, which means that younger nodes are stored at the beginning of the collision chain and older nodes at the end of the collision chain. Thus, as newly created nodes are added to the collision chain, they must be inserted at the beginning of the chain. This ordering of the collision chain allows for the improved processing as will be seen from the example.

Assume now that the BDD processing requires the creation of a new node (j,r,y). As. described above, before the node is created, it is determined whether the node already exists in memory so that duplicate nodes will not be created. Referring now to FIG. 4, at step 402 the method begins looking for node (j,r,y) in memory 504. In step 404 the hash key (j,r,y) is computed. Assume for this example that the hash key (j,r,y) is 3456. In step 406 the address at location 3456 in the hash table 502 is retrieved and stored in mem-loc-ptr. For purposes of the example, the mem-loc-ptr is 50000.

In step 408 it is determined whether 50000 is greater than 40000, because 40000 is the greater memory location of the two child nodes (r and y) of the node being looked for. Since 50000 is greater than 40000 control is passed to step 410 to retrieve the node (x,a,b) stored at location 50000. This step is performed because since the test at step 408 was yes, then the node (x,a,b) stored at location 50000 could be the node being looked for, because it is younger than both the child nodes of the node being looked for.

In step 412 is it determined that the node (x,a,b) is not the same as the node (j,r,y) being searched for, and control passes to step 414 where it is determined that there is a collision link pointer in node (x,a,b). In step 416 the collision link pointer 30000 is retrieved from node (x,a,b) and is stored as the new mem-loc-ptr. Control is passed to step 408 where it is determined that 30000 is not greater than max-mem-loc(r,y) (40000) and therefore control is passed to step 420 and the method ends without finding the node (j,r,y).

It is noted that the last test at step 408 indicates that the node identified in the collision chain link of node (x,a,b), namely node (z,f,g), is older than the youngest child node (node (y,c,d)), and therefore cannot be the node being searched for. It is also noted that this determination was made without having to retrieve the node (z,f,g) from memory, thus saving a main memory access. Also note that by using the inventive method of ordering the collision links youngest to oldest, there was no need to retrieve node (b,h,v) from memory, which is part of the collision link for the node being searched for. Thus, in accordance with the invention, two main memory accesses have been avoided.

Figure 6:
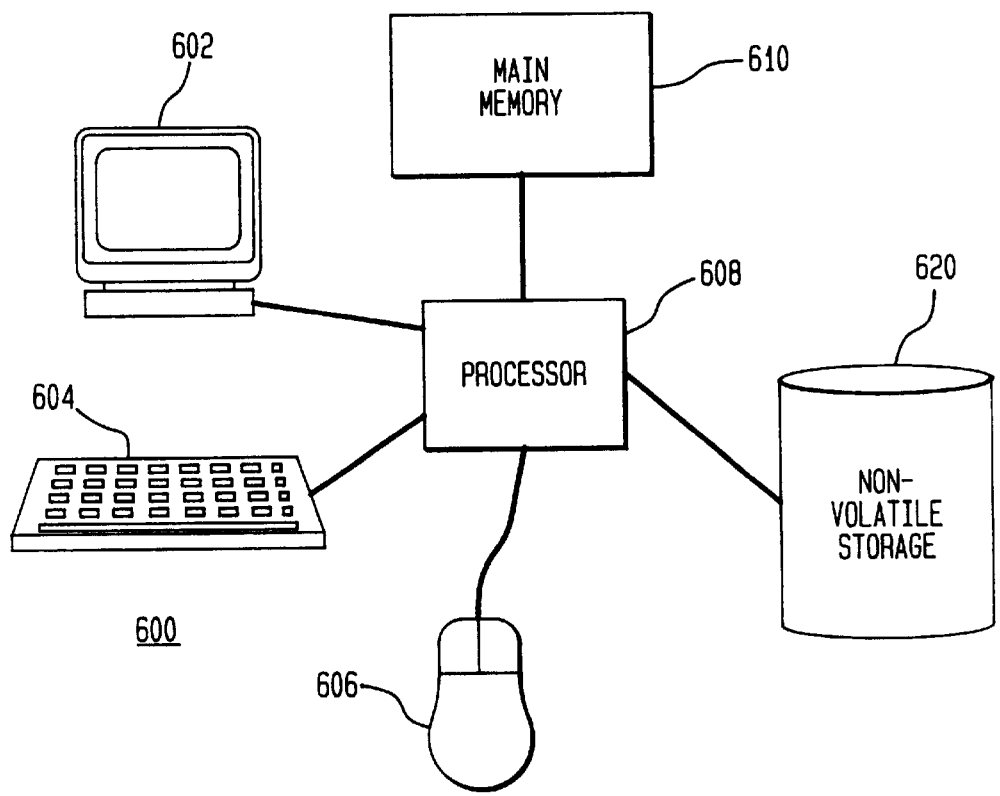
FIG. 6 shows a schematic of the components of a computer system which can be configured to implement the present invention.

The present invention may be implemented on any type of well known computer system. As used herein, the term computer includes any device or machine capable of accepting data, applying prescribed processes to the data, and supplying the results of the processes. The functions of the present invention are advantageously performed by a programmed digital computer of the type which is well known in the art, an example of which is shown in FIG. 6. FIG. 6 shows a computer system 600 which comprises a display monitor 602, a textual input device such as a computer keyboard 604, a graphical input device such as mouse 606, a computer processor, i.e., CPU, 608, a main memory unit 610, and a non-volatile storage device such as a disk drive 620. The main memory unit 610 stores, for example, computer program code and data. The computer processor 608 is connected to the display monitor 602, the memory unit 610, the non-volatile storage device 620, the keyboard 604, and the mouse 606. The external storage device 620 may be used for the storage of data and computer program code. The computer processor 608 executes the computer program code which is stored in memory unit 610. During execution, the processor may access data stored in memory unit 610, and may access data stored in the non-volatile storage device 620. The computer system 600 may suitably be any one of the types which are well known in the art such as a mainframe computer, a minicomputer, a workstation, or a personal computer. Of course, one skilled in the art will appreciate that there are many other components which may be included in a computer system but which are not shown in FIG. 6 for clarity.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing form the scope and spirit of the invention. For example, although the present invention describes a certain memory ordering to determine the chronological age of a node, a reverse memory ordering could also be used. Further, a mechanism other than memory ordering could be used to determine the age of a node.

What is claimed is:

1. A method of searching for a specific node of a binary decision diagram (BDD) in a memory of a computer system comprising:

performing a hash function on said specific node to obtain a hash key, said specific node including pointers to a parent node and two child nodes, said two child nodes having memory addresses that indicate an order of creation;

indexing into a hash table using said hash key and obtaining a collision chain memory address that points to a collision chain in said memory, said collision chain includes a plurality of chronologically ordered linked BDD entry nodes, said BDD entry nodes including a BDD specific node and a collision chain link;

comparing said collision chain memory address with said specific node's said two child nodes memory addresses;

if said collision chain memory address is not chronologically newer than said specific node's said two child nodes' memory addresses, then terminating said method;

if said collision chain memory address is chronologically newer than said specific node's said two child nodes' memory addresses, then sequentially retrieving said plurality of chronologically ordered linked BDD entry nodes associated with said collision chain; and terminating said sequential retrieval upon determining that said BDD specific node matches said specific node, said BDD entry node's collision chain link is not linked to another BDD entry node or if said BDD child nodes' memory addresses are chronologically older than said specific node's said child nodes' memory addresses.

2. The method of claim 1 further comprising:

storing newly created nodes in memory locations which are higher than any previously created node; and terminating said method after retrieving the last BDD entry node from said collision chain which is stored in a memory location which is higher than the memory locations of each of said two child nodes of said specific node.

3. The method of claim 1 further comprising:

storing newly created nodes in memory locations which are lower than any previously created node; and terminating said method after retrieving the last BDD entry node from said collision chain which is stored in a memory location which is lower than the memory location of each of said two child nodes of said specific node.

4. A computer readable medium storing computer program instructions capable of execution on a computer system for searching for a specific node of a BDD in a memory of a computer system, said method comprising:

performing a hash function on a specific node to obtain a hash key, said specific node including pointers to a parent node and two child nodes;

indexing into a hash table using said hash key and obtaining a memory address that points to a collision chain in said memory, said collision chain includes a plurality of chronologically ordered linked BDD entry nodes, said BDD entry nodes including a BDD specific node and a collision chain link;

comparing said memory address with addresses associated with child nodes of said specific node;

retrieving BDD entry node if said memory address is chronologically newer than addresses associated with child nodes of said specific node;

terminating said method upon determining that said BDD entry node matches said specific node or after retrieving the last BDD entry node from collision chain which was created subsequent to said child nodes of said specific node.

5. The computer readable medium of claim 4 wherein said computer program instructions further comprising:

storing newly created nodes in memory locations which are higher than any previously created node; and terminating said method after retrieving the last BDD entry node from said collision chain which is stored in a memory location which is higher than the memory location of either of said child nodes of said specific node.

6. The computer readable medium of claim 4 wherein said computer program instructions further comprising:

storing newly created nodes in memory locations which are lower than any previously created node; and terminating said method after retrieving the last BDD entry node from said collision chain which is stored in a memory location which is lower than the memory location of either of said child nodes of said specific node.

* * * * *